(12) United States Patent
Choo et al.

(10) Patent No.: US 7,319,634 B2
(45) Date of Patent: Jan. 15, 2008

(54) ADDRESS CONVERTER SEMICONDUCTOR DEVICE AND SEMICONDUCTOR MEMORY DEVICE HAVING THE SAME

(75) Inventors: Chul-Hwan Choo, Paju-si (KR); Ho-Sung Song, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/501,905

(22) Filed: Aug. 8, 2006

(65) Prior Publication Data

US 2007/0153619 A1    Jul. 5, 2007

(30) Foreign Application Priority Data

Dec. 29, 2005    (KR) .................. 10-2005-0133932

(51) Int. Cl.
*G11C 8/00*    (2006.01)
(52) U.S. Cl. ................... 365/230.06; 365/230.09; 365/233
(58) Field of Classification Search ........... 365/230.06, 365/230.09, 233, 239, 189.08
See application file for complete search history.

(56) References Cited

U.S. PATENT DOCUMENTS 5,608,682 A * 3/1997 Jinbo et al. ............... 365/222
6,121,815 A * 9/2000 Terada et al. .............. 327/292

FOREIGN PATENT DOCUMENTS

| JP | 11-260068 | 9/1999 |
| JP | 2003-249087 | 9/2003 |
| JP | 2004-070461 | 3/2004 |
| KR | 1998-0005003 | 3/1998 |

* cited by examiner

*Primary Examiner*—Anh Phung
*Assistant Examiner*—Hien Nguyen
(74) *Attorney, Agent, or Firm*—Mills & Onello, LLP

(57) ABSTRACT

An address converter of a semiconductor device comprises a clock generating portion for generating at least one clock signal when a power voltage is applied; a control signal setting means for setting a control signal during a mode setting operation; a polarity selecting signal generating portion for generating at least one polarity selecting signal in response to the at least one clock signal and the control signal; and an address converting portion for converting at least one bit of an address applied from an external portion to output a converted address in response to the at least one polarity selecting signal.

33 Claims, 8 Drawing Sheets

US 7,319,634 B2

ADDRESS CONVERTER SEMICONDUCTOR DEVICE AND SEMICONDUCTOR MEMORY DEVICE HAVING THE SAME

CROSS-REFERENCE TO RELATED APPLICATION

This application claims the benefit of Korean Patent Application No. 10-2005-0133932, filed Dec. 29, 2005, the contents of which are hereby incorporated herein by reference in their entirety.

BACKGROUND OF THE INVENTION

1. Field of the Invention

The present invention relates to an address converter of a semiconductor device and a semiconductor memory device having the same and, more particularly, to an address converter of a semiconductor device in which different addresses are internally designated whenever electrical power is applied even though a same address is externally designated, and a semiconductor memory device having the same.

2. Description of the Related Art

A semiconductor device needs an address to read and write data. The address is used to designate a certain memory cell in a memory cell array of a semiconductor memory device so that data can be inputted or outputted. The address is allocated by an external control device.

The address of the semiconductor memory device comprises a combination of a row address for selecting a row of the memory cell array and a column address for selecting a column of the memory cell array.

FIG. 1 is a block diagram illustrating a conventional semiconductor memory device.

In the case of a synchronous memory device such as a synchronous dynamic random access memory (SDRAM), the semiconductor memory device receives a clock CLK from an external portion and uses it as a reference for its operation.

An address register 24 receives an address ADD and a clock CLK from an external portion, classifies the address ADD into a row address RA and a column address CA, and synchronizes them with the clock CLK and outputs them to a row decoder 22 and a column decoder 23, respectively.

A command decoder 25 receives a command corn and outputs a row address strobe (RAS) signal and a CAS before RAS (CBR) signal for an active operation to the row decoder 22. The command decoder 25 outputs a column address strobe (CAS) signal to the column decoder 23 for a read or write operation. The command decoder 25 outputs a write enable signal WE to a data IO portion 26 to control data input and output.

The row decoder 22 receives the RAS signal from the command decoder 25 and performs an active operation to receive the row address RA from the address register 24 to thereby designate a certain word line among a plurality of word lines of the memory cell array 21. The row decoder 22 receives the CBR signal from the command decoder 25 to have the memory cell array 21 to perform a refresh operation.

The column decoder 23 is controlled by the CAS signal applied from the command decoder 25 during the read or write operation, and receives the column address CA from the address register 24 to designate a certain bit line among a plurality of bit lines of the memory cell array 21.

The memory cell array 21 includes a plurality of word lines arranged in a transverse direction, a plurality of bit lines arranged in a vertical direction, and memory cells arranged at crossing points between the word lines and the bit lines. The memory cell array 21 further includes a plurality of sense amplifiers for detecting and amplifying data.

In the memory cell array 21, when a memory cell arranged at a crossing point between the word line selected by the row decoder 22 and the bit line selected by the column decoder 23 is selected, the sense amplifier outputs data DQi of the selected memory cell to the external portion or amplifies and stores data DQi inputted from the external portion in the memory cell array according to the read or write command applied from the command decoder 25.

The data IO portion 26 receives the write enable signal WE from the command decoder 25 to receive/output data from/to the memory cell arranged at a crossing point between the word line designated by the row decoder 22 and the bit line designated by the column decoder 23.

A mode setting portion 27 receives a mode setting signal MRS from the command decoder 25 when a power stabilization signal (not shown) is generated after electrical power is applied to the semiconductor memory device. The mode setting portion 27 combines a setting signal applied in the form of the address ADD from the external portion to store a default setting of the semiconductor memory device in response to the mode setting signal MRS. That is, the mode setting portion 27 receives a setting signal through a terminal to which the address ADD is inputted, and performs the default setting of the semiconductor memory device when the electrical power is applied to the semiconductor memory device.

The semiconductor device having the above described memory structure is activated from a designated initial address in address order and then performs the read or write operation when the electrical power is applied, but loses all of its information when the electrical power is not applied. When the electrical power is applied again so that a process for storing data is performed, the read or write operation is repeated in same address order as the previous process. Thus, the use frequency of a certain memory cell increases, and so the memory cell having high use frequency is stressed over time. Due to the hot carrier effect which may occur in a hyperfine process, the stress applied to the memory cell becomes more serious, resulting in a bad influence upon the lifespan and reliability of the semiconductor memory device.

The same phenomenon happens in a flash memory which is a non-volatile memory device, but the flash memory has a feature for storing information even though the electrical power is not applied and thus using this feature, address information of the memory cells used in a previous process is stored. When the electrical power is applied again, addresses of the used memory cells which are stored in a certain region are read, and a write process is allocated from a non-used address.

According to Japanese Patent Publication No. 2003-249087, in a computer system with a central processing device, a memory device and an address converting circuit, when reset, using, as a mask, a plurality of certain bits of a start address outputted from a central processing unit, the start address is converted. Japanese Patent Publication No. 2003-249087 is characterized in that designated addresses of ROM and RAM are converted and a discrete converting circuit is arranged outside the memory device.

According to Japanese Patent Publican No. 2003-249087, a non-volatile memory device includes a reset address setting circuit to designate a discretionary certain address as an initial start address when the electrical power is applied or after reset. Japanese Patent Publican No. 2003-249087 uses the feature of the non-volatile memory device for reset address setting circuit to designate a certain address, and it cannot be used in a volatile memory device.

In the conventional semiconductor devices described above, since the initial address is designated in the same way, the use frequency of the certain memory cell increases, and the memory cell having the high use frequency gets stress, resulting in the short lifespan and low reliability of the semiconductor device. In order to resolve the above problems, the discrete address converting device is arranged outside the semiconductor memory device or the non-volatile memory device is used to convert the initial address, but it cannot be used in the volatile memory device.

SUMMARY OF THE INVENTION

It is an feature of the present invention to provide an address converter of a semiconductor device which is embedded in the semiconductor device and converts an address applied from an external portion.

It is another feature of the present invention to provide a semiconductor device in which an address applied from an external portion can be converted.

According to one aspect, the present invention is directed to an address converter of a semiconductor device, comprising: a clock generating portion for generating at least one clock signal when a power voltage is applied; a control signal setting means for setting a control signal during a mode setting operation; a polarity selecting signal generating portion for generating at least one polarity selecting signal in response to the at least one clock signal and the control signal; and an address converting portion for converting at least one bit of an address applied from an external portion to output a converted address in response to the at least one polarity selecting signal.

In one embodiment, the clock generating portion includes at least one ring oscillator in which a cycle variation of the clock signal generated by the power voltage and a surrounding temperature is large.

In one embodiment, the polarity selecting signal generating portion includes at least one D-flip flop.

In one embodiment, the address converting portion includes at least one XOR circuit.

In one embodiment, the control signal setting means additionally sets a test control signal during the mode setting operation.

In one embodiment, the address converting portion includes: a first transmission gate for transmitting the converted address in response to the test control signal; a second transmission gate for transmitting the at least one polarity selecting signal in response to the test control signal; and a XOR gate for receiving and XORing the converted address and the polarity selecting signal transmitted from the second transmission gate to output the same address as the address applied from the external portion.

According to another aspect, the present invention is directed to an address converter of a semiconductor device, comprising: a clock generating portion for generating a clock signal when a power voltage is applied; a delay portion for delaying the clock signal generated in the clock generating portion to output at least one delayed clock signal; a control signal setting means for setting a control signal during a mode setting operation; a polarity selecting signal generating portion for generating at least one polarity selecting signal in response to the at least one delayed clock signal and the control signal; and an address converting portion for converting at least one bit of an address applied from an external portion to output a converted address in response to the at least one polarity selecting signal.

In one embodiment, the clock generating portion includes a ring oscillator in which a cycle variation of the clock signal generated by the power voltage and a surrounding temperature is large.

In one embodiment, the delay portion includes at least one buffer, and when the delay portion includes a plurality of buffers, the buffers have different delay times each other.

In one embodiment, the polarity selecting signal generating portion includes at least one D-flip flop.

In one embodiment, the address converting portion includes at least one XOR circuit.

In one embodiment, the control signal setting means additionally sets a test control signal during the mode setting operation.

In one embodiment, the address converting portion includes: a first transmission gate for transmitting the converted address in response to the test control signal; a second transmission gate for transmitting the at least one polarity selecting signal in response to the test control signal; and a XOR gate for receiving and XORing the converted address and the polarity selecting signal transmitted from the second transmission gate to output the same address as the address applied from the external portion.

According to another aspect, the present invention is directed to a semiconductor memory device, comprising: a memory cell array including a plurality of memory cells, each of the plurality of memory cells connected between each of a plurality of word lines and each of a plurality of bit lines; a row decoder for accessing the plurality of word lines in response to a row address; a column decoder for accessing the plurality of bit lines in response to a column address; a mode setting portion for setting a control signal during a mode setting operation; a command decoder for analyzing a command applied from an external portion and instructing an active operation or a read or write operation; a data IO portion for receiving/outputting data from/to a memory cell designated by the row decoder and the column decoder; a polarity selecting portion for generating at least one clock signal when a power voltage is applied and generating at least one polarity selecting signal in response to the at least one clock signal and the control signal; and an address converting portion for converting at least one bit of the row address of an address applied from the external portion during the active operation and converting at least one bit of the column address of the address applied from the external portion during the read or write operation, thereby outputting a converted address, in response to the at least one polarity selecting signal.

In one embodiment, the polarity selecting portion includes: a clock generating portion for generating the at least one clock signal when the power voltage is applied; and a polarity selecting signal generating portion for generating at least one polarity selecting signal in response to the at least one clock signal the control signal.

In one embodiment, the clock generating portion includes at least one ring oscillator in which a cycle variation of the clock signal generated by the power voltage and a surrounding temperature is large.

In one embodiment, the polarity selecting portion includes: a clock generating portion for generating the clock signal when the power voltage is applied; a delay portion for delaying the clock signal generated in the clock generating portion to output at least one delayed clock signal; and a polarity selecting signal generating portion for generating at least one polarity selecting signal in response to the at least one delayed clock signal and the control signal.

In one embodiment, the clock generating portion includes a ring oscillator in which a cycle variation of the clock signal generated by the power voltage and a surrounding temperature is large.

In one embodiment, the delay portion includes at least one buffer, and when the delay portion includes a plurality of buffers, the buffers have different delay times each other.

In one embodiment, the address converting portion includes at least one XOR circuit.

In one embodiment, the mode setting portion additionally sets a test control signal during the mode setting operation.

In one embodiment, the address converting portion includes: a first transmission gate for transmitting the converted address in response to the test control signal; a second transmission gate for transmitting the at least one polarity selecting signal in response to the test control signal; and a XOR gate for receiving and XORing the converted address and the polarity selecting signal transmitted from the second transmission gate to output the same address as the address applied from the external portion.

In one embodiment, The semiconductor memory device further comprises a burst control portion for generating a sequential column address and outputting the sequential column address to the address converting portion during a burst operation for reading or writing data of a sequential address in response to the column address applied from the address converting portion.

According to another aspect, the present invention is directed to a semiconductor memory device, comprising: a plurality of memory cell array banks each of which includes a plurality of memory cells, each of the plurality of memory cells connected between each of a plurality of word lines and each of a plurality of bit lines; a row decoder for accessing the plurality of word lines in response to a row address; a column decoder for accessing the plurality of bit lines in response to a column address; a bank selecting portion for accessing the memory cell array bank in response to a bank address; a mode setting portion for setting a control signal during a mode setting operation; a command decoder for analyzing a command applied from an external portion and instructing an active operation or a read or write operation; a data 10 portion for receiving/outputting data from/to a memory cell designated by the bank selecting portion, the row decoder and the column decoder; a polarity selecting portion for generating at least one clock signal when a power voltage is applied and generating at least one polarity selecting signal in response to the at least one clock signal and the control signal; and an address converting portion for converting at least one bit of the bank address and the row address of an address applied from the external portion to generate a converted bank address and a converted row address during the active operation and converting at least one bit of the column address of the address applied from the external portion during the read or write operation, in response to the at least one polarity selecting signal.

In one embodiment, the polarity selecting portion includes: a clock generating portion for generating the at least one clock signal when the power voltage is applied; and a polarity selecting signal generating portion for generating at least one polarity selecting signal in response to the at least one clock signal and the control signal.

In one embodiment, the clock generating portion includes at least one ring oscillator in which a cycle variation of the clock signal generated by the power voltage and a surrounding temperature is large.

In one embodiment, the polarity selecting portion includes: a clock generating portion for generating a clock signal when the power voltage is applied; a delay portion for delaying the clock signal generated in the clock generating portion to output at least one delayed clock signal; and a polarity selecting signal generating portion for generating at least one polarity selecting signal in response to the at least one delayed clock signal and the control signal.

In one embodiment, the clock generating portion includes a ring oscillator in which a cycle variation of the clock signal generated by the power voltage and a surrounding temperature is large.

In one embodiment, the delay portion includes at least one buffer, and when the delay portion includes a plurality of buffers, the buffers have different delay times each other.

In one embodiment, the address converting portion includes at least one XOR circuit.

In one embodiment, the mode setting portion additionally sets a test control signal during the mode setting operation.

In one embodiment, the address converting portion includes: a first transmission gate for transmitting the converted address in response to the test control signal; a second transmission gate for transmitting the at least one polarity selecting signal in response to the test control signal; and a XOR gate for receiving and XORing the converted address and the polarity selecting signal transmitted from the second transmission gate to output the same address as the address applied from the external portion.

In one embodiment, the semiconductor memory device further comprises a burst control portion for generating a sequential column address and outputting the sequential column address to the address converting portion during a burst operation for reading or writing data of a sequential address in response to the column address applied from the address converting portion.

BRIEF DESCRIPTION OF THE DRAWINGS

The foregoing and other objects, features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention.

DETAILED DESCRIPTION OF PREFERRED EMBODIMENTS OF THE INVENTION

Figure 2:
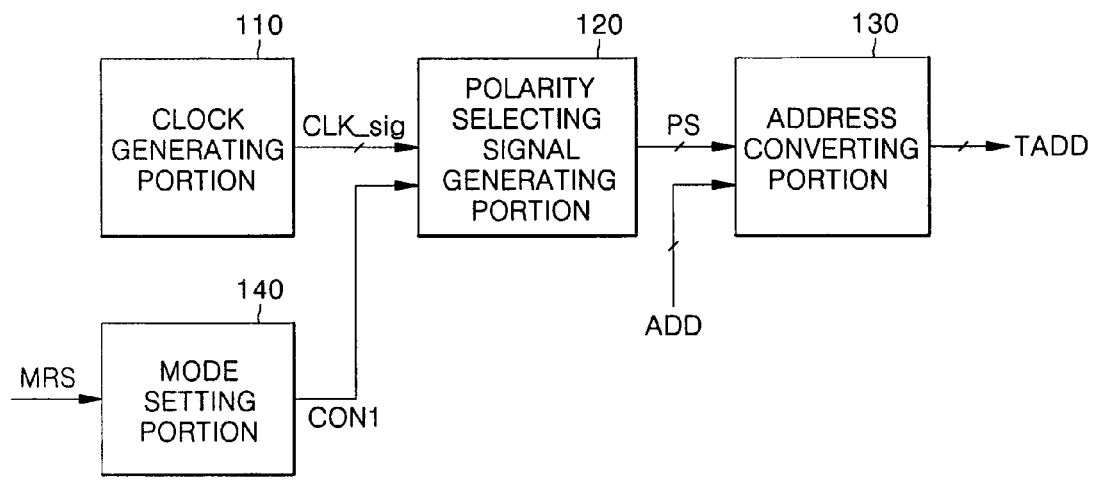
FIG. 2 is a block diagram illustrating an address converter of a semiconductor device according to a first embodiment of the present invention.

FIG. 2 is a block diagram illustrating an address converter of a semiconductor device according to a first embodiment of the present invention.

Figure 3:
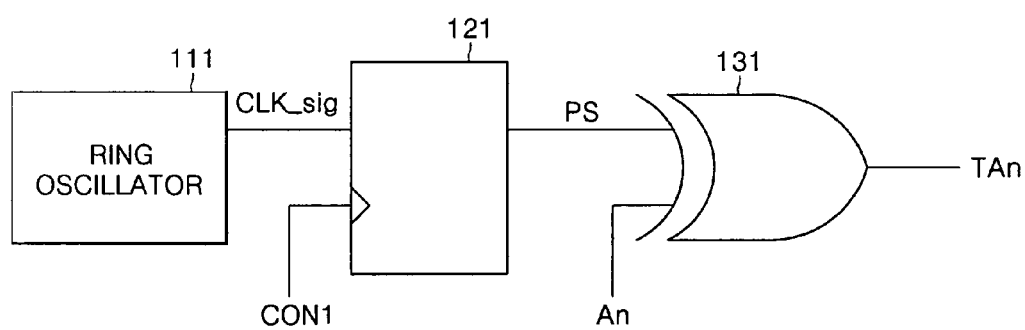
FIG. 3 is a detailed block diagram illustrating the address converter of the semiconductor device of FIG. 2, where a 1-bit address is converted.

FIG. 3 is a detailed block diagram illustrating the address converter of the semiconductor device of FIG. 2, where a 1-bit address is converted.

Referring to FIGS. 2 and 3, a clock generating portion 110 includes at least one ring oscillator 111 to generate clock signals CLK_sig having different cycles when the electrical power is applied to the semiconductor device. The ring oscillator 111 is a typical ring oscillator 111 employed in a semiconductor memory device such as DRAM, and its cycle variation greatly depends on a power voltage and a temperature. That is, the cycle is short at a high voltage or a low temperature, whereas the cycle is long at a low voltage or a high temperature. There are many techniques for reducing the cycle variation of the ring oscillator 111, but the ring oscillators 111 having a high cycle variation is used since the present invention uses the cycle variation.

A mode setting portion 140 outputs a control signal CON1 in response to a mode setting signal MRS applied from the external portion. The mode setting signal MRS is a signal applied from the external portion for an initial setting of the semiconductor device, and it is set after the electrical power is applied and is maintained while the electrical power is applied.

A polarity selecting signal generating portion 120 includes at least one D-flip flop 121 and randomly generates a polarity selecting signal PS in response the clock signal CLK_sig generated from the ring oscillator 111 of the clock generating portion 110 and the control signal CON1 applied from the mode setting portion 140. In this context, "randomly" means that the outputted polarity selecting signal PS is not constant because the cycle variation of each ring oscillator 111 is severe and thus the clock signal CLK_sig applied to the polarity selecting signal generating portion 120 is not constant when the control signal CON1 is applied.

An address converting portion 130 includes at least one XOR circuit 131 and XORs the polarity selecting signal PS and one address bit An of the addresses ADD applied from the external portion to output a converted address TADD. A converted address bit TAn has an opposite polarity to the address bit An when the polarity selecting signal PS has a high level, and the converted address bit TAn has a same polarity as the address bit An when the polarity selecting signal PS has a low level.

In the address converter of the semiconductor device described above, the control signal CON1 is generated once when the electrical power is applied and then maintained, and so the address ADD applied from the external portion is continuously converted while the electrical power is applied.

That is, the address converter of the semiconductor device of FIGS. 2 and 3 randomly converts, in a bit unit, the address applied from the external portion while the electrical power is applied to thereby generate the converted address. It can be applied to a 1 bit or all bits of the address since the address applied from the external portion can be converted in a bit unit.

However, the converting address converter randomly maps the addresses internally, and so the external portion cannot be aware of information about a defective memory cell during a test.

Figure 4:
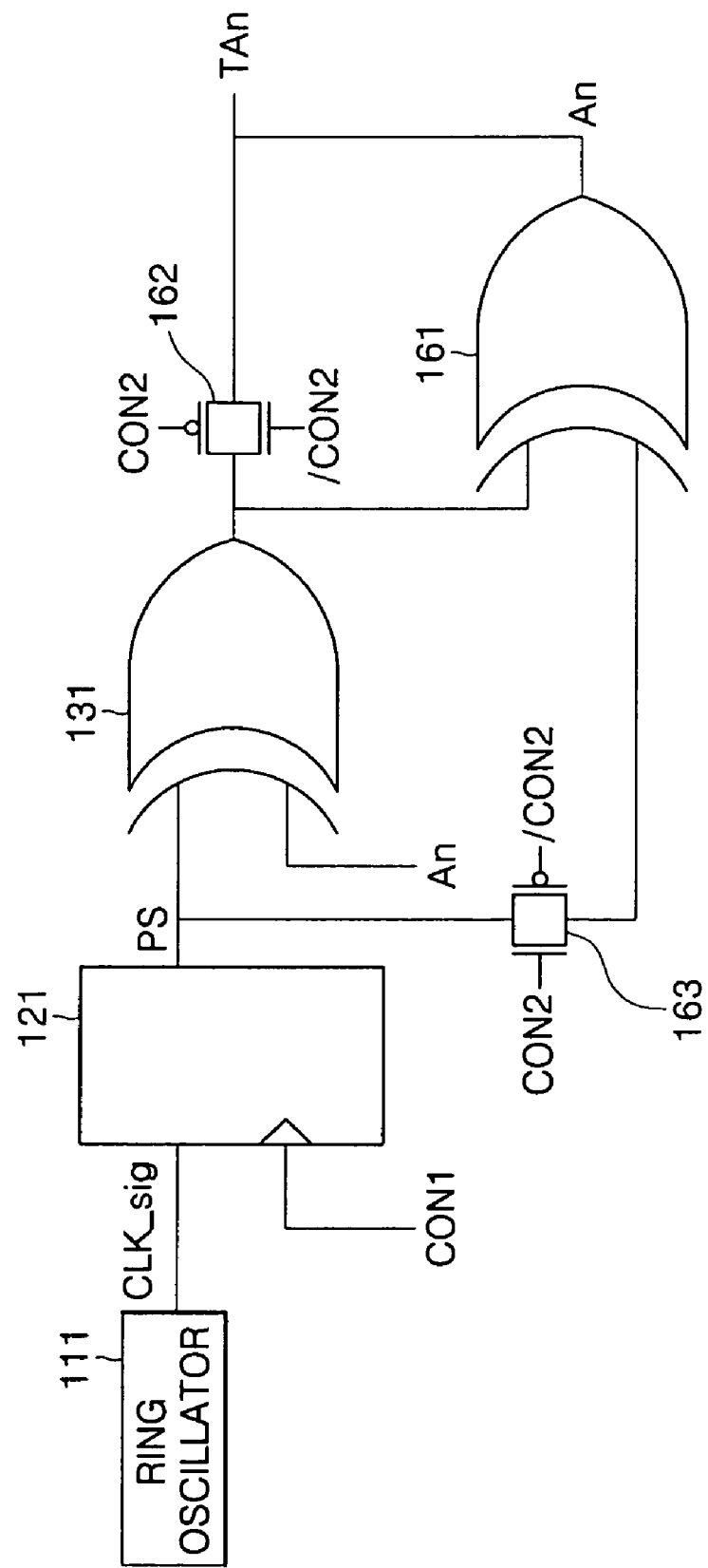
FIG. 4 is a block diagram illustrating a modified address converter of the semiconductor device of FIG. 3, where a test path for a memory cell test is added.

An address converter of a semiconductor device for compensating the above problem is shown in FIG. 4.

FIG. 4 is a block diagram illustrating a modified address converter of the semiconductor device of FIG. 3, where a test path for a memory cell test is added.

In FIG. 4, the ring oscillator 111, the D-flip flop 121 and the first XOR circuit 131 are same as those of FIG. 3.

A first transmission gate 162 does not transmit the converted address bit TAn when it is in a test mode and transmits the converted address bit TAn when it is not in the test mode, in response to a control signal CON2 which is outputted from the mode setting portion 140 of FIG. 2 to indicate whether it is in the test mode or not.

A second transmission gate 163 receives the polarity selecting signal PS from the D-flip flop 121, and transmits it when it is in the test mode and does not transmit it when it is not in the test mode, in response to the control signal CON2.

A second XOR circuit 161 receives the converted address bit TAn from the first XOR circuit 131 and receives the polarity selecting signal PS from the second transmission gate 163 when it is in the test mode, and XORs them to generate the address bit An.

Figure 1:
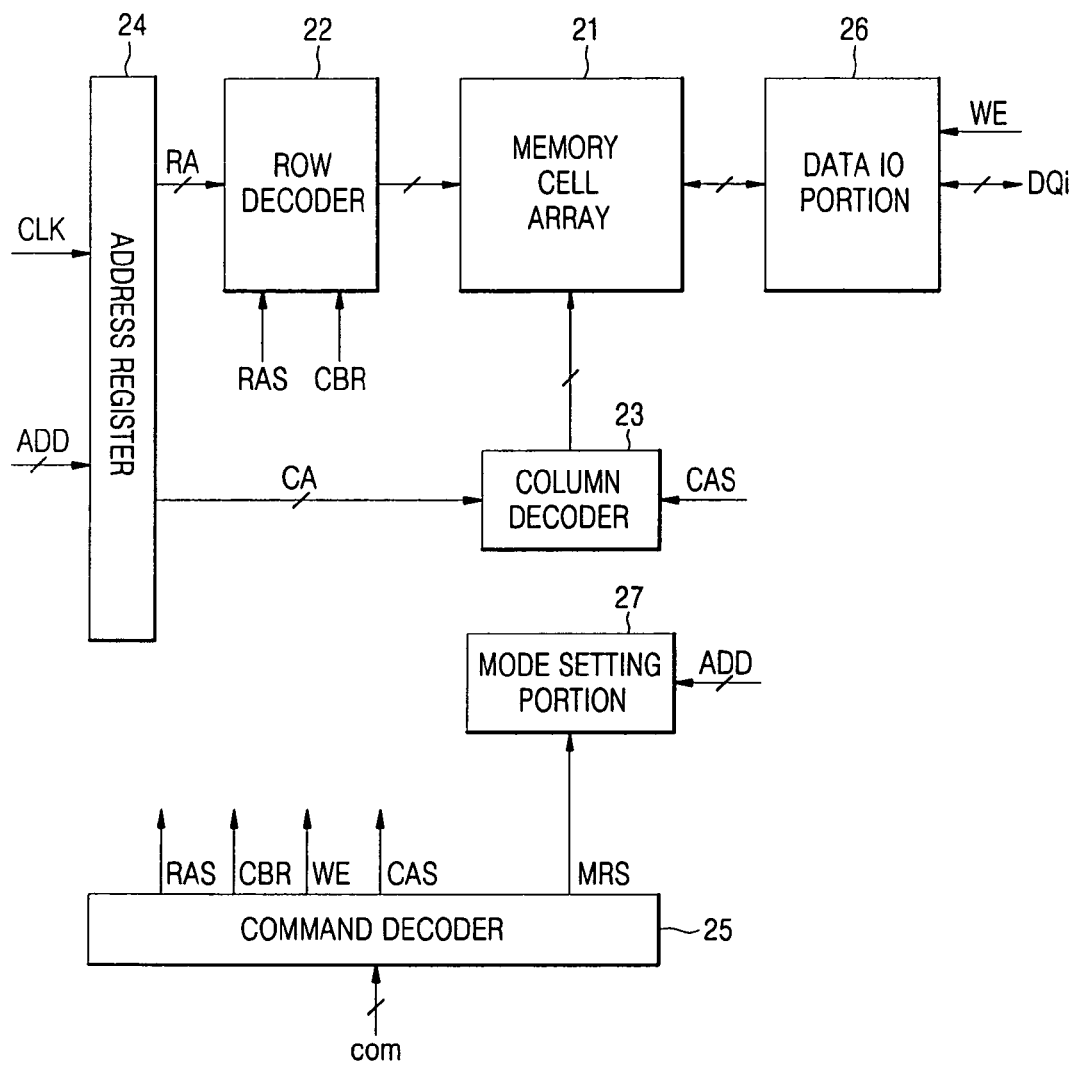
FIG. 1 is a block diagram illustrating a conventional semiconductor memory device.

In FIG. 4 the two control signals CON1 and CON2 are different signals, but one control signal CON received from the mode setting portion 27 of FIG. 1 can be used as the two control signals CON1 and CON2.

The modified address converter of the semiconductor device of FIG. 4 outputs the address ADD "as is" without converting it in the test mode, and thus the external test device can be aware of information about the defective memory cell.

Figure 5:
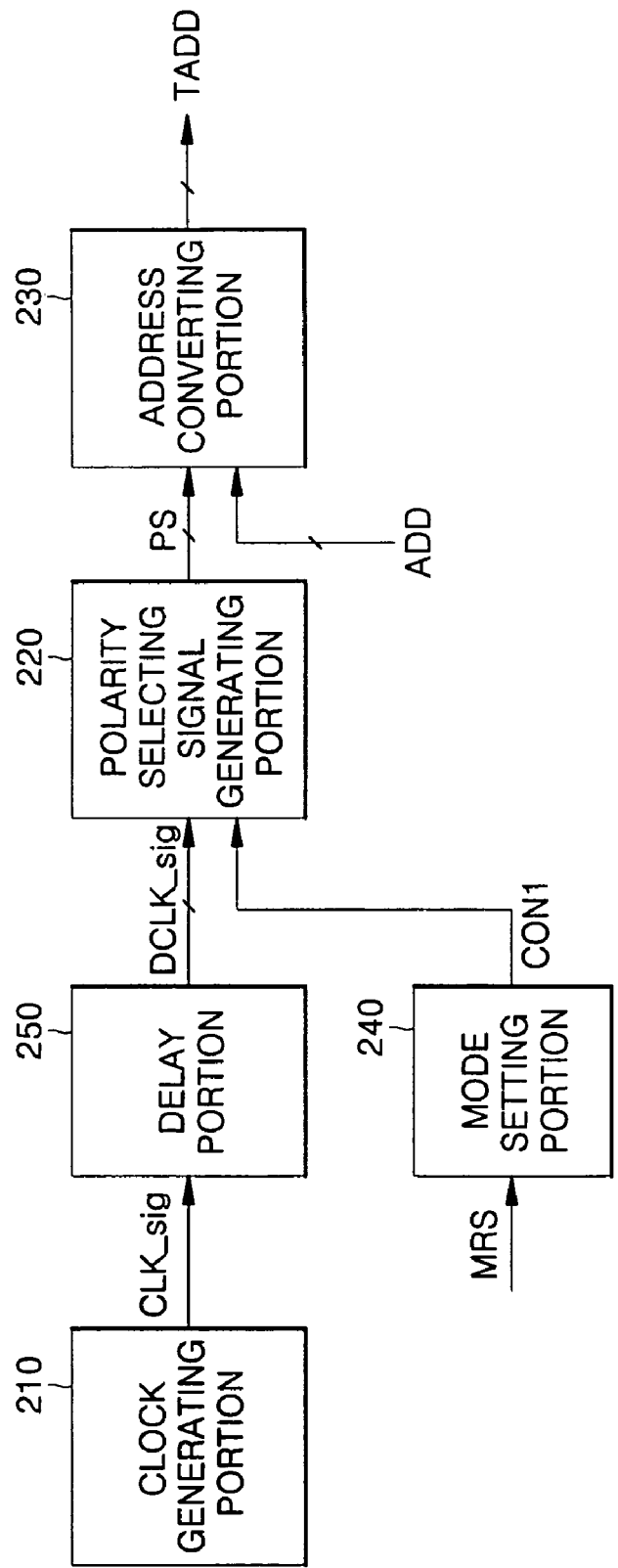
FIG. 5 is a block diagram illustrating an address converter of a semiconductor device according to a second embodiment of the present invention.

FIG. 5 is a block diagram illustrating an address converter of a semiconductor device according to a second embodiment of the present invention.

Figure 6:
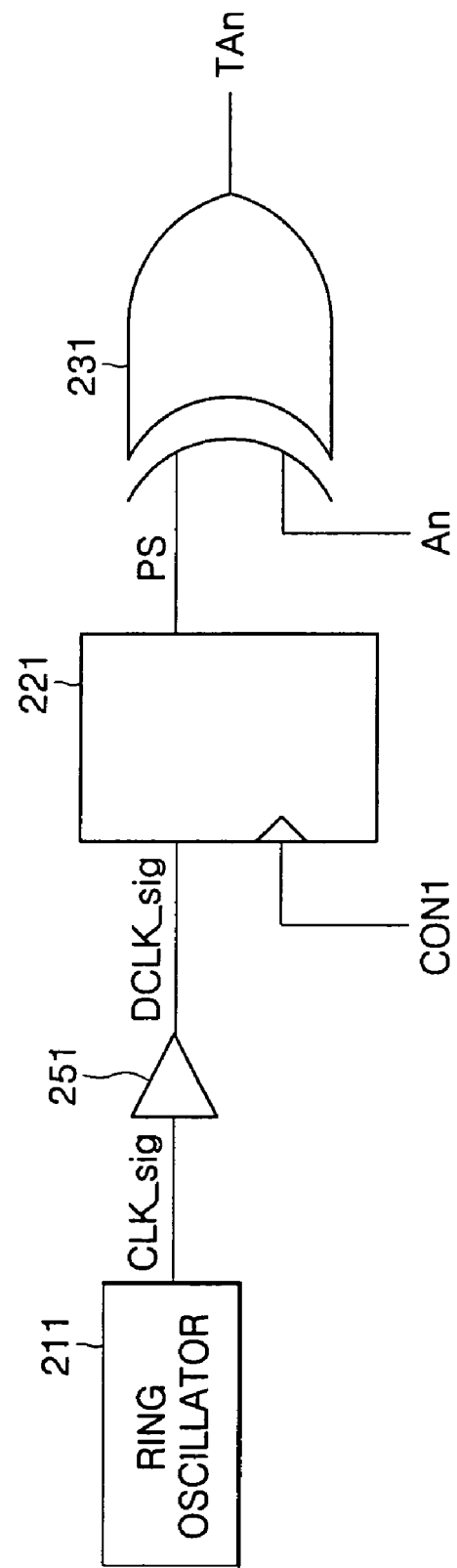
FIG. 6 is a detailed block diagram illustrating the address converter of the semiconductor device of FIG. 6, where a 1-bit address is converted.

FIG. 6 is a detailed block diagram illustrating the address converter of the semiconductor device of FIG. 6, where a 1-bit address is converted.

In FIGS. 5 and 6, a polarity selecting signal generating portion 220, an address converting portion 230, and a mode setting portion 240 of FIG. 5 are same as those of FIG. 2, and a D-flip flop 221 and a first XOR circuit 231 of FIG. 6 are same as those of FIG. 3.

The clock generating portion 110 of FIG. 2 includes at least one ring oscillator 111, but a clock generating portion 210 of FIG. 5 includes one ring oscillator 211. Here, the ring oscillator 211 has a feature that its cycle variation greatly depends on a power voltage and a surrounding temperature as described in FIG. 4.

A delay portion 250 includes at least one buffer 251 and delays the clock signal CLK_sig generated from the ring oscillator 211 of the clock generating portion 210 during different time periods to generate a delayed clock signal DCLK_sig.

That is, the address converter of FIGS. 5 and 6 includes one ring oscillator 211 and at least one buffer 251 and converts the address ADD applied from the external portion to output the converted address TADD.

For the test mode shown in FIG. 4, the test path can be additionally configured, but its operation is same as that of FIG. 4, and thus its description is not repeated.

Table 1 shows an exemplary address conversion performed by the address converter of the semiconductor device to which a 4-bit address ADD is applied.

applied, and the internal address is converted to "0000" when the address ADD of "1111" is applied.

Figure 7:
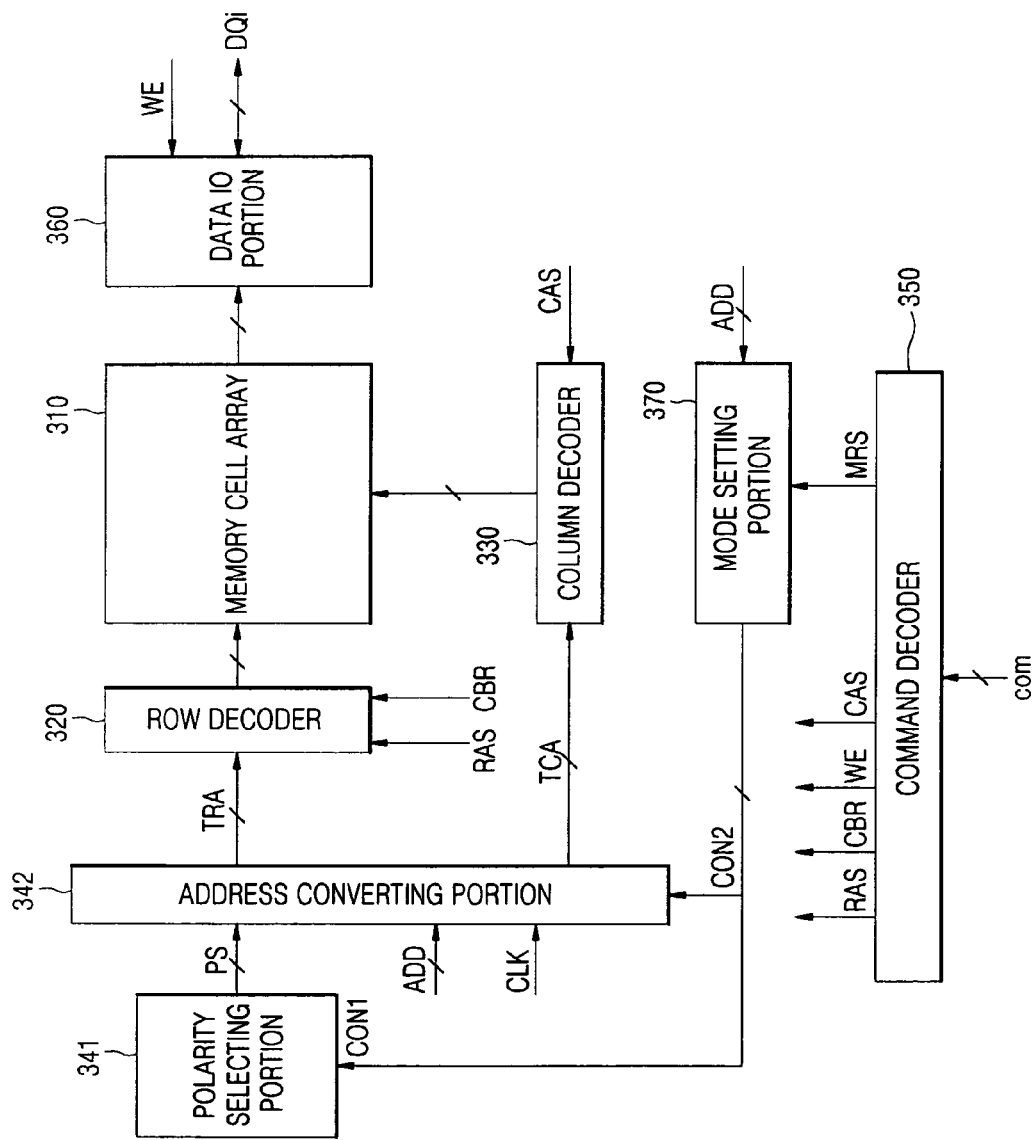
FIG. 7 is a block diagram illustrating a semiconductor memory device having an address converter of a semiconductor device according to a first embodiment of the present invention.

FIG. 7 is a block diagram illustrating a semiconductor memory device having an address converter of a semiconductor device according to a first embodiment of the present invention.

A polarity selecting portion 341 corresponds to the combination of the polarity selecting signal generating portion

TABLE 1

| Address (ADD) | | | | First converted address (TADD1) | | | | Second converted address (TADD2) | | | |
|---|---|---|---|---|---|---|---|---|---|---|---|
| A3 | A2 | A1 | A0 | TA3 | TA2 | TA1 | TA0 | TA3 | TA2 | TA1 | TA0 |
| 0 | 0 | 0 | 0 | 0 | 1 | 0 | 0 | 1 | 1 | 1 | 1 |
| 0 | 0 | 0 | 1 | 0 | 1 | 0 | 1 | 1 | 1 | 1 | 0 |
| 0 | 0 | 1 | 0 | 0 | 1 | 1 | 0 | 1 | 1 | 0 | 1 |
| 0 | 0 | 1 | 1 | 0 | 1 | 1 | 1 | 1 | 1 | 0 | 0 |
| 0 | 1 | 0 | 0 | 0 | 0 | 0 | 0 | 1 | 0 | 1 | 1 |
| 0 | 1 | 0 | 1 | 0 | 0 | 0 | 1 | 1 | 0 | 1 | 0 |
| 0 | 1 | 1 | 0 | 0 | 0 | 1 | 0 | 1 | 0 | 0 | 1 |
| 0 | 1 | 1 | 1 | 0 | 0 | 1 | 1 | 1 | 0 | 0 | 0 |
| 1 | 0 | 0 | 0 | 1 | 1 | 0 | 0 | 0 | 1 | 1 | 1 |
| 1 | 0 | 0 | 1 | 1 | 1 | 0 | 1 | 0 | 1 | 1 | 0 |
| 1 | 0 | 1 | 0 | 1 | 1 | 1 | 0 | 0 | 1 | 0 | 1 |
| 1 | 0 | 1 | 1 | 1 | 1 | 1 | 1 | 0 | 1 | 0 | 0 |
| 1 | 1 | 0 | 0 | 1 | 0 | 0 | 0 | 0 | 0 | 1 | 1 |
| 1 | 1 | 0 | 1 | 1 | 0 | 0 | 1 | 0 | 0 | 1 | 0 |
| 1 | 1 | 1 | 0 | 1 | 0 | 1 | 0 | 0 | 0 | 0 | 1 |
| 1 | 1 | 1 | 1 | 1 | 0 | 1 | 1 | 0 | 0 | 0 | 0 |

As shown in Table 1, as bits A3, A2, A1, and A0 of the address ADD, "0000", "0001", . . . , "1111" may be applied.

In Table 1, the first converted address TADD1 corresponds to a case where the control signal CON1 is applied when the clock signal CLK_sig corresponding to a third bit has a high level and the control signal CON1 is applied when the clock signal CLK_sig corresponding to first, second, and fourth bits has a low level. Thus, the third bit TA2 of the address ADD is inverted before outputted, and the first bit (TA0), the second bit (TA1) and the fourth bit (TA3) are outputted "as is".

That is, the converted address TADD1 is outputted such that the internal address is converted to "0100" when the address ADD of "0000" is applied, the internal address is converted to "0101" when the address ADD of "0001" is applied, and the internal address is converted to "1011" when the address ADD of "1111" is applied.

When a certain bit of the address ADD is converted to output the converted address TADD as shown in Table 1, even though the address ADD proceeds sequentially from a first address of a memory, the converted address TADD proceeds from a random address of the memory and does not proceed sequentially.

In Table 1, the second converted address TADD2 corresponds to a case where the control signal CON1 is applied when the clock signal CLK_sig corresponding to all bits has a high level. All bits (TA3, TA2, TA1, and TA0) are inverted before outputted. Accordingly, when the address applied from the external portion proceeds sequentially from the first address of the memory as shown in Table 1, the second converted address proceeds in reverse order from the last address of the memory.

That is, the converted address TADD2 is outputted such that the internal address is converted to "1111" when the address ADD of "0000" is applied, the internal address is converted to "1110" when the address ADD of "0001" is 120 and the clock generating portion 110 of FIG. 2 or the combination of the polarity selecting signal generating portion 220, the delay portion 250 and the clock generating portion 210 of FIG. 5 and generates at least one clock signal when the electrical power is applied and generates at least one polarity selecting signal PS in response to the at least one clock signal and the control signal CON1 applied from the mode setting portion 370.

An address converting portion 342 has a function for converting the address ADD applied from the external portion to output a converted row address TRA and a converted column address TCA in addition to a function of the address register 24 of FIG. 1. The address converting portion 342 includes at least one XOR circuit as shown in FIGS. 3 and 6. In response to at least one polarity selecting signal PS applied from the polarity selecting portion 341, the address converting portion 342 converts at least one bit of the row address of the address ADD applied from the external portion to output the converted row address TRA during an active operation, and converts at least one bit of the column address of the address ADD to output the converted column address TCA during the read or write operation. In the case of the synchronous memory device, it receives the clock signal CLK applied from the external portion and outputs the converted row address TRA and the converted column address TCA, synchronized with the clock.

The address converting portion 342 additionally includes the first and second transmission gates and the second XOR circuit as shown in FIG. 4, and the test path can be added so that the memory cell test can be performed in response to the control signal CON2 which is applied from the mode setting portion 370 to indicate whether it is in the test mode or not.

The first transmission gate does not transmit the converted address bit when it is in a test mode and transmits the converted address bit TAn when it is not in the test mode, in response to the control signal CON2 outputted from the mode setting portion 370.

A second transmission gate receives the polarity selecting signal PS from the polarity selecting portion 341, and transmits it when it is in the test mode and does not transmit it when it is not in the test mode, in response to the control signal CON2 applied from the mode setting portion 370.

A second XOR circuit receives the converted address bit from the first XOR circuit and receives the polarity selecting signal from the second transmission gate when it is in the test mode, and XORs them to generate the address bit.

As in FIG. 4 the two control signals CON1 and CON2 are different signals, but one control signal CON received from the mode setting portion 370 can be used as the two control signals CON1 and CON2.

A row decoder 320 is controlled by the CBR signal and the RAS signal and receives the converted row address TRA converted by the address converting portion 342 to designate a certain row of a memory cell array 310.

A column decoder 330 receives the converted column address TCA converted by the address converting portion 342 to designate a certain column of the corresponding memory array 310.

The memory cell array 310 includes a plurality of word lines arranged in a transverse direction, a plurality of bit lines arranged in a vertical direction, and memory cells arranged at crossing points between the word lines and the bit lines. The memory cell array 310 further includes a plurality of sense amplifiers for detecting and amplifying data.

In the memory cell array 310, when a memory cell arranged at a crossing point between the word line selected by the row decoder 320 and the bit line selected by the column decoder 330 is selected, the sense amplifier outputs data DQi of the selected memory cell to the external portion or amplifies and stores data DQi inputted from the external portion in the memory cell array according to the read or write command applied from a command decoder.

The command decoder 350 analyzes a command corn applied from the external portion and outputs the mode setting signal MRS for an initial setting of the semiconductor memory device to the mode setting portion 370, and outputs the row address strobe (RAS) signal and the CBR signal for the active operation to the row decoder 320. The command decoder 350 outputs the column address strobe (CAS) signal to the column decoder 330 for the read or write operation. The command decoder 350 outputs the write enable signal WE to a data IO portion 360 to control data input and output.

A mode setting portion 370 receives a mode setting signal MRS from the command decoder 350 when a power stabilization signal (not shown) is generated after the electrical power is applied to the semiconductor memory device. The mode setting portion 370 combines setting signals applied in the form of the address ADD from the external portion to store a default setting of the semiconductor memory device in response to the mode setting signal MRS. The mode setting signal MRS is generated once when the electrical power is applied and continuously maintains the setting while the electrical power is maintained. The mode setting portion 370 outputs the control signal CON1 to the polarity selecting portion 341 to generate the polarity selecting signal PS and outputs the control signal CON2 to the address converting portion 342 to perform the test operation, in response to the mode setting signal MRS.

A data IO portion 360 outputs data DQi from the memory cell of the address ADD designated by the row decoder 320 and the column decoder 330 or stores data DQi applied from the external portion in the designated memory cell, according to the write enable signal WE applied from the command decoder 350.

The semiconductor memory device of FIG. 7 converts at least one bit of the address ADD applied from the external portion to randomly change a memory cell of the memory cell array 310 designated by the row decoder 320 and the column decoder 330 to a random memory cell.

The control signal CON1 applied to the polarity selecting portion 341 and the control signal CON2 applied to the address converting portion 342 are applied once and then continuously maintained, and so the address converting portion 342 continuously converts and outputs the address ADD applied from the external portion.

Figure 8:
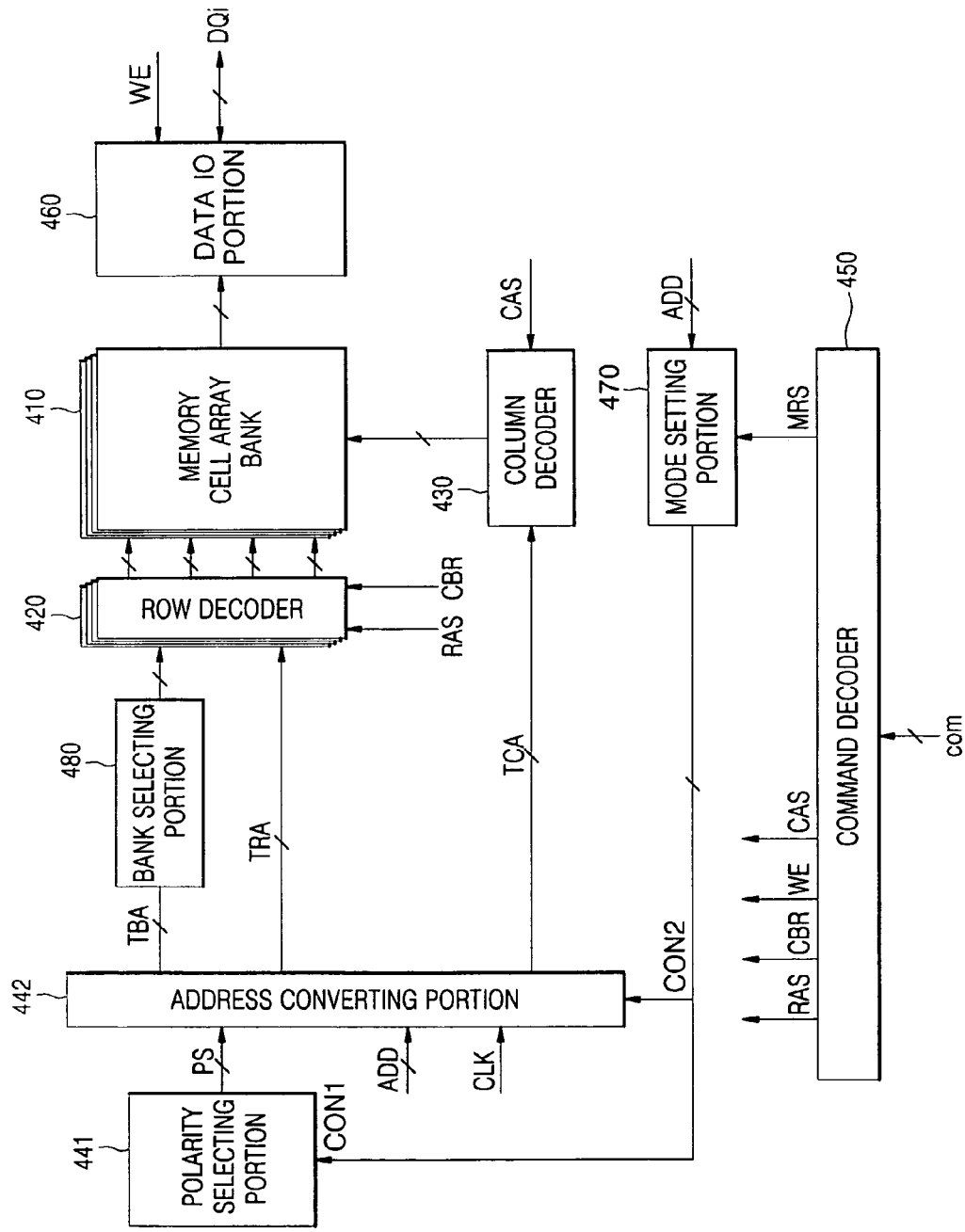
FIG. 8 is a block diagram illustrating a semiconductor memory device having an address converter of a semiconductor device according to a second embodiment of the present invention.

FIG. 8 is a block diagram illustrating a semiconductor memory device having an address converter of a semiconductor device according to a second embodiment of the present invention.

The semiconductor memory device of FIG. 8 has a memory cell array bank structure and includes a plurality of row decoders 420 and a plurality of memory cell array banks 410.

Like that of FIG. 7, a polarity selecting portion 441 generates at least one clock signal when the electrical power is applied and generates at least one polarity selecting signal PS in response to the at least one clock signal and the control signal CON1 applied from the mode setting signal 470.

An address converting portion 442 converts at least one bit of the bank address and the row address of an address applied from the external portion to generate a converted bank address TBA or a converted row address TRA and respectively output them to a bank selecting portion 480 and a row decoder 420 during the active operation, and converts at least one bit of a column address of the address ADD applied from the external portion and outputs a converted column address TCA during the read or write operation, in response to at least one polarity selecting signal PS applied from the polarity selecting portion 441.

The address converting portion 442 additionally includes the first and second transmission gates and the second XOR circuit, and the test path can be added so that the memory cell test can be performed in response to the control signal CON2 which is applied from a mode setting portion 470 to indicate whether it is in the test mode or not.

The bank selecting portion 480 receives the converted bank address TBA applied from the address converting portion 442, and selects and activates one of a plurality of row decoders 420 in order to select one of a plurality of memory cell array banks 410.

One of a plurality of row decoders 420 is selected by the bank selecting portion 480, and the selected row decoder 420 receives the converted row address TRA converted by the address converting portion 442 to designate a certain row of a corresponding memory cell array bank among a plurality of memory cell array banks 410.

A column decoder 430 receives the converted column address TCA converted by the address converting portion 442 to designate a certain column of the corresponding memory array bank 410.

Each of a plurality of memory cell array banks 410 includes memory cell arrays, and each memory cell array includes a plurality of word lines arranged in a transverse direction, a plurality of bit lines arranged in a vertical direction, and memory cells arranged at crossing points between the word lines and the bit lines. Each memory cell array further includes a plurality of sense amplifiers for detecting and amplifying data.

In the memory cell array of each of a plurality of memory cell array banks 410, when one memory cell array bank is selected by the bank selecting portion 480 and a memory cell arranged at a crossing point between the word line selected by the row decoder 420 and the bit line selected by the column decoder 430 is selected, the sense amplifier outputs data DQi of the selected memory cell to the external portion or amplifies and stores data DQi inputted from the external portion in the memory cell array according to the read or write command applied from a command decoder 450.

A mode setting portion 470 receives a mode setting signal MRS from a command decoder 450 when a power stabilization signal (not shown) is generated after the electrical power is applied to the semiconductor memory device. The mode setting portion 470 combines setting signals applied in the form of the address ADD from the external portion to store a default setting of the semiconductor memory device in response to the mode setting signal MRS. The mode setting portion 470 outputs the control signal CON1 to the polarity selecting portion 441 to generate the polarity selecting signal PS and outputs the control signal CON2 to the address converting portion 442 to perform the test operation, in response to the mode setting signal MRS.

The command decoder 450 analyzes a command corn applied from the external portion and outputs the mode setting signal MRS for an initial setting of the semiconductor memory device to the mode setting portion 470, and outputs the row address strobe (RAS) signal and the CBR signal for the active operation to the row decoder 420, like FIG. 7. The command decoder 450 outputs the column address strobe (CAS) signal to the column decoder 430 for the read or write operation. The command decoder 450 outputs the write enable signal WE to a data IO portion 460 to control data input and output.

A data IO portion 460 outputs data DQi from the memory cell of the address ADD designated by the row decoder 420 and the column decoder 430 or stores data DQi applied from the external portion in the designated memory cell, according to the write enable signal WE applied from the command decoder 450 like FIG. 7.

Figure 9:
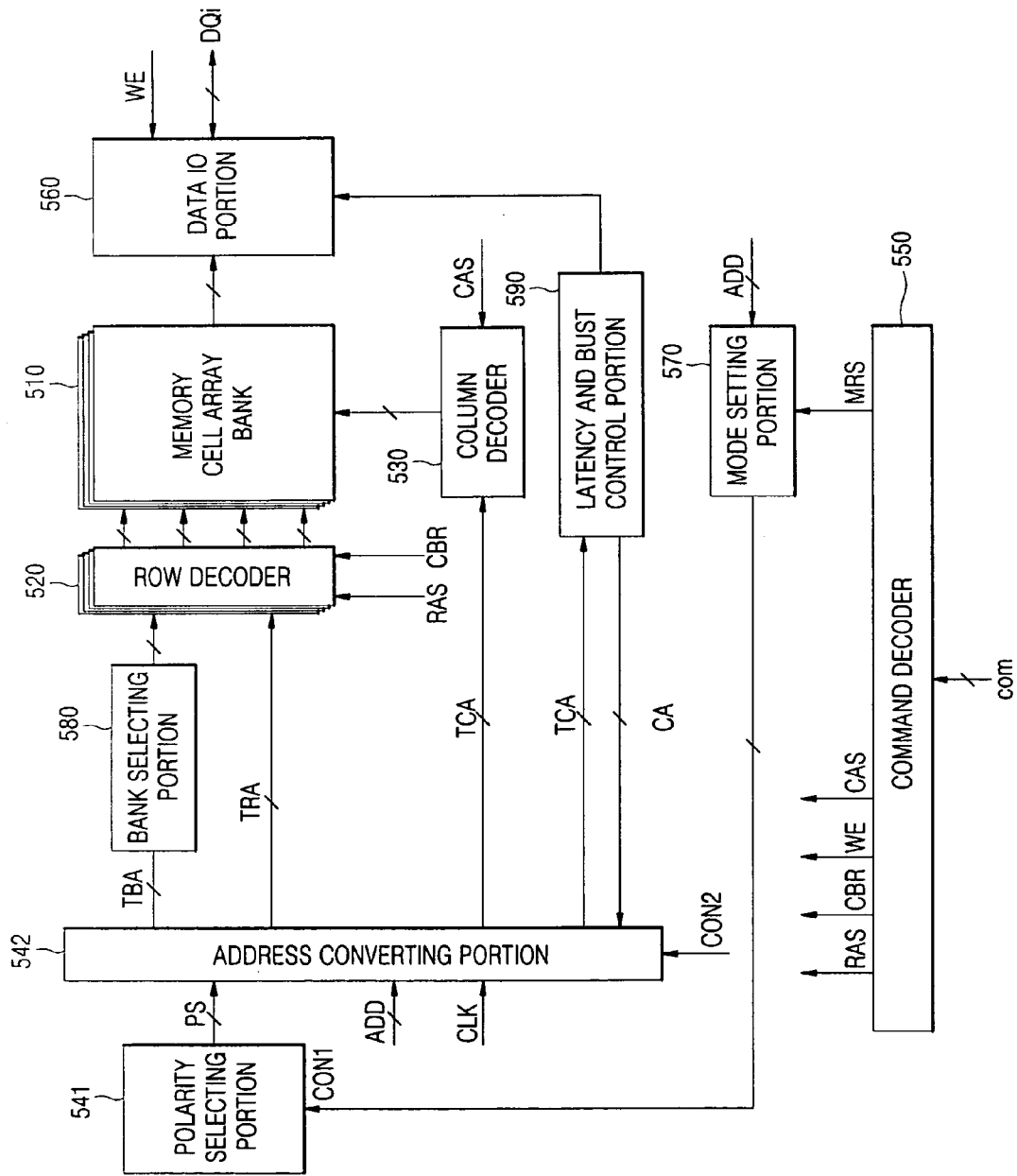
FIG. 9 is a block diagram illustrating a semiconductor memory device having an address converter of a semiconductor device according to a third embodiment of the present invention.

FIG. 9 is a block diagram illustrating a semiconductor memory device having an address converter of a semiconductor device according to a third embodiment of the present invention.

The semiconductor memory device of FIG. 9 has a memory cell array bank structure and supports a latency function and a burst read or write function.

The latency function is referred to as a function of a synchronous semiconductor memory device in which an external command is applied to designate in advance a time when a semiconductor memory device outputs data.

The burst function is referred to as a function for sequentially generated a predetermined number of addresses ADD to designate a memory cell and to input/output data even though the address ADD is not additionally applied when the address ADD is applied from the external portion.

A polarity selecting portion 541 generates at least one clock signal when the electrical power is applied and generates at least one polarity selecting signal PS in response to the at least one clock signal and the control signal CON1 applied from the mode setting signal 570.

An address converting portion 542 converts at least one bit of the bank address and the row address of the address ADD applied from the external portion to generate a converted bank address TBA or a converted row address TRA and respectively output them to a bank selecting portion 580 and a row decoder 520 during the active operation, and converts at least one bit of a column address of the address ADD applied from the external portion and outputs a converted column address TCA during the read or write operation, in response to at least one polarity selecting signal PS applied from the polarity selecting portion 541. In addition, the address converting portion 442 output a converted column address TCA, generated by converting at least one bit of a column address of the address ADD applied from the external portion, to a latency and burst control portion 590 for the burst function, and receives and converts a column address CA generated from the latency and burst control portion 590 and outputs a converted column address TCA to a column decoder.

The address converting portion 542 additionally includes the first and second transmission gates and the second XOR circuit, and the test path can be added so that the memory cell test can be performed in response to the control signal CON2 which is applied from a mode setting portion 570 to indicate whether it is in the test mode or not.

The bank selecting portion 580 receives a converted bank address TBA applied from the address converting portion 542, and selects and activates one of a plurality of row decoders 520 in order to select one of a plurality of memory cell array banks 510.

One of a plurality of row decoders 520 is selected by the bank selecting portion 580, and the selected row decoder 520 receives the converted row address TRA converted by the address converting portion 542 to designate a certain row of a corresponding memory cell array bank among a plurality of memory cell array banks 510.

A column decoder 530 receives the converted column address TCA converted by the address converting portion 542 to designate a certain column of the corresponding memory cell array bank 510.

Each of a plurality of memory cell array banks 510 includes memory cell arrays, and each memory cell array includes a plurality of word lines arranged in a transverse direction, a plurality of bit lines arranged in a vertical direction, and memory cells arranged at crossing points between the word lines and the bit lines. Each memory cell array further includes a plurality of sense amplifiers for detecting amplifying data.

In the memory cell array of each of a plurality of memory cell array banks 510, when one memory cell array bank is selected by the bank selecting portion 580 and a memory cell arranged at a crossing point between the word line selected by the row decoder 520 and the bit line selected by the column decoder 530 is selected, the sense amplifier outputs data DQi of the selected memory cell to the external portion or amplifies and stores data DQi inputted from the external portion in the memory cell array according to the read or write command applied from a command decoder 550.

A mode setting portion 570 receives a mode setting signal MRS from a command decoder 550 when a power stabilization signal (not shown) is generated after the electrical power is applied to the semiconductor memory device. The mode setting portion 570 combines setting signals applied in the form of the address ADD from the external portion to store a default setting of the semiconductor memory device in response to the mode setting signal MRS. The mode setting portion 570 outputs the control signal CON1 to the polarity selecting portion 541 to generate the polarity selecting signal PS and outputs the control signal CON2 to the address converting portion 542 so that the test operation can be performed, in response to the mode setting signal MRS. The mode setting portion 570 also outputs a latency setting and a burst length setting among the stored default setting to the latency and burst control portion 590.

The command decoder 550 analyzes a command corn applied from the external portion and outputs the mode setting signal MRS for an initial setting of the semiconductor memory device to the mode setting portion 570, and outputs the row address strobe (RAS) signal and the CBR signal for the active operation to the row decoder 520. The command decoder 550 outputs the column address strobe (CAS) signal to the column decoder 530 for the read or write operation. The command decoder 550 outputs the write enable signal WE to a data IO portion 560 to control data input and output.

The latency and burst control portion 590 of FIG. 9 receives the latency setting from the mode setting portion 570 to control a time for the data IO portion 560 to output data DQi, and receives the burst length setting for designating the address generating number from the mode setting portion 570 and receives the converted column address TCA generated by the address converting portion 542 converting the column address of the address ADD applied from the external portion, and sequentially generates the column address CA based on the converted column address TCA and outputs it to the address converting portion 542.

Since the latency and burst control portion 590 sequentially generates the column address CA, when a certain row of the corresponding memory cell array bank 510 is designated by the generated column address CA, there may occur an error in the converted column address TCA which is applied from the external portion and converted. Thus, like the address ADD applied from the external portion, the column address CA generated from the latency and burst control portion 590 is also outputted to the address converting portion 542 and then converted, thereby preventing the error which may internally occur in advance.

The data IO portion 560 outputs data DQi from the memory cell of the address ADD designated by the row decoder 520 and the column decoder 530 or stores data DQi applied from the external portion in the designated memory cell, according to the write enable signal WE applied from the command decoder 550. However, the data IO portion 560 can output data DQi to the external portion at a timing designated by the latency and burst control portion 590.

In the above-described embodiments, it has been described that the semiconductor memory device having the memory cell array bank structure of FIGS. 8 and 9 has the latency function and the burst read or write function, but the semiconductor memory device of FIG. 7 having no memory cell array bank structure can also have the latency function and the burst read or write function.

In the semiconductor memory devices of FIGS. 7 to 9, the address register of the conventional semiconductor memory device is replaced with the address converting portion 342, 442, or 542 of the polarity selecting portion 341, 441, or 541, but the address register can be additionally arranged.

One address converting portion 342, 442, or 542 is used to convert the address, but discrete address converting portions can be arranged for the bank address, row address and the column address, and the address can be converted in a discrete bit unit.

The two control signals CON1 and CON2 are outputted from the mode setting portion 370, 470, or 570, and the mode setting portion of the typical semiconductor memory device can use a signal for designating the test mode or the normal mode to use only one control signal CON.

In the above described embodiments, the address converter of the semiconductor device of the present invention has been described focusing on the semiconductor memory device, but it can be applied to other semiconductor devices.

As described above, the address converter of the semiconductor device and the semiconductor memory device according to the present invention are set to convert the address differently whenever the electrical power is applied and so randomly maps the address to designate different addresses whenever the electrical power is applied even though the input is applied to the same address, thereby dispersing the stress concentrated on the certain memory cell resulting in the long lifespan and high reliability of the semiconductor memory device. Since the defective memory cell can be checked in the test mode, an efficient test can be performed. Further, the present invention can be used in the volatile memory device as well as the non-volatile memory device.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. An address converter of a semiconductor device, comprising:
   a clock generating portion for generating at least one clock signal when a power voltage is applied;
   a control signal setting means for setting a control signal during a mode setting operation;
   a polarity selecting signal generating portion for generating at least one polarity selecting signal in response to the at least one clock signal and the control signal; and
   an address converting portion for converting at least one bit of an address applied from an external portion to output a converted address in response to the at least one polarity selecting signal.

2. The converter of claim 1, wherein the clock generating portion includes at least one ring oscillator in which a cycle variation of the clock signal generated by the power voltage and a surrounding temperature is large.

3. The converter of claim 1, wherein the polarity selecting signal generating portion includes at least one D-flip flop.

4. The converter of claim 1, wherein the address converting portion includes at least one XOR circuit.

5. The converter of claim 1, wherein the control signal setting means additionally sets a test control signal during the mode setting operation.

6. The converter of claim 5, wherein the address converting portion includes:
   a first transmission gate for transmitting the converted address in response to the test control signal;
   a second transmission gate for transmitting the at least one polarity selecting signal in response to the test control signal; and
   a XOR gate for receiving and XORing the converted address and the polarity selecting signal transmitted from the second transmission gate to output the same address as the address applied from the external portion.

7. An address converter of a semiconductor device, comprising:
   a clock generating portion for generating a clock signal when a power voltage is applied;

a delay portion for delaying the clock signal generated in the clock generating portion to output at least one delayed clock signal;

a control signal setting means for setting a control signal during a mode setting operation;

a polarity selecting signal generating portion for generating at least one polarity selecting signal in response to the at least one delayed clock signal and the control signal; and an address converting portion for converting at least one bit of an address applied from an external portion to output a converted address in response to the at least one polarity selecting signal.

8. The converter of claim 7, wherein the clock generating portion includes a ring oscillator in which a cycle variation of the clock signal generated by the power voltage and a surrounding temperature is large.

9. The converter of claim 7, wherein the delay portion includes at least one buffer, and when the delay portion includes a plurality of buffers, the buffers have different delay times each other.

10. The converter of claim 7, wherein the polarity selecting signal generating portion includes at least one D-flip flop.

11. The converter of claim 7, wherein the address converting portion includes at least one XOR circuit.

12. The converter of claim 7, wherein the control signal setting means additionally sets a test control signal during the mode setting operation.

13. The converter of claim 12, wherein the address converting portion includes:

a first transmission gate for transmitting the converted address in response to the test control signal;

a second transmission gate for transmitting the at least one polarity selecting signal in response to the test control signal; and a XOR gate for receiving and XORing the converted address and the polarity selecting signal transmitted from the second transmission gate to output the same address as the address applied from the external portion.

14. A semiconductor memory device, comprising:

a memory cell array including a plurality of memory cells, each of the plurality of memory cells connected between each of a plurality of word lines and each of a plurality of bit lines;

a row decoder for accessing the plurality of word lines in response to a row address;

a column decoder for accessing the plurality of bit lines in response to a column address;

a mode setting portion for setting a control signal during a mode setting operation;

a command decoder for analyzing a command applied from an external portion and instructing an active operation or a read or write operation;

a data IO portion for receiving/outputting data from/to a memory cell designated by the row decoder and the column decoder;

a polarity selecting portion for generating at least one clock signal when a power voltage is applied and generating at least one polarity selecting signal in response to the at least one clock signal and the control signal; and an address converting portion for converting at least one bit of the row address of an address applied from the external portion during the active operation and converting at least one bit of the column address of the address applied from the external portion during the read or write operation, thereby outputting a converted address, in response to the at least one polarity selecting signal.

15. The device of claim 14, wherein the polarity selecting portion includes:

a clock generating portion for generating the at least one clock signal when the power voltage is applied; and a polarity selecting signal generating portion for generating at least one polarity selecting signal in response to the at least one clock signal and the control signal.

16. The device of claim 15, wherein the clock generating portion includes at least one ring oscillator in which a cycle variation of the clock signal generated by the power voltage and a surrounding temperature is large.

17. The device of claim 14, wherein the polarity selecting portion includes a clock generating portion for generating the clock signal when the power voltage is applied;

a delay portion for delaying the clock signal generated in the clock generating portion to output at least one delayed clock signal; and a polarity selecting signal generating portion for generating at least one polarity selecting signal in response to the at least one delayed clock signal and the control signal.

18. The device of claim 17, wherein the clock generating portion includes a ring oscillator in which a cycle variation of the clock signal generated by the power voltage and a surrounding temperature is large.

19. The device of claim 17, wherein the delay portion includes at least one buffer, and when the delay portion includes a plurality of buffers, the buffers have different delay times each other.

20. The device of claim 14, wherein the address converting portion includes at least one XOR circuit.

21. The device of claim 14, wherein the mode setting portion additionally sets a test control signal during the mode setting operation.

22. The device of claim 21, wherein the address converting portion includes:

a first transmission gate for transmitting the converted address in response to the test control signal;

a second transmission gate for transmitting the at least one polarity selecting signal in response to the test control signal; and a XOR gate for receiving and XORing the converted address and the polarity selecting signal transmitted from the second transmission gate to output the same address as the address applied from the external portion.

23. The device of claim 14, further comprising, a burst control portion for generating a sequential column address and outputting the sequential column address to the address converting portion, in response to the column address applied from the address converting portion during a burst operation for reading or writing data of a sequential address.

24. A semiconductor memory device, comprising:

a plurality of memory cell array banks each of which includes a plurality of memory cells, each of the plurality of memory cells connected between each of a plurality of word lines and each of a plurality of bit lines;

a row decoder for accessing the plurality of word lines in response to a row address;

a column decoder for accessing the plurality of bit lines in response to a column address;

a bank selecting portion for accessing the memory cell array bank in response to a bank address;

a mode setting portion for setting a control signal during a mode setting operation;

a command decoder for analyzing a command applied from an external portion and instructing an active operation or a read or write operation;

a data IO portion for receiving/outputting data from/to a memory cell designated by the bank selecting portion, the row decoder and the column decoder;

a polarity selecting portion for generating at least one clock signal when a power voltage is applied and generating at least one polarity selecting signal in response to the at least one clock signal and the control signal; and an address converting portion for converting at least one bit of the bank address and the row address of an address applied from the external portion to generate a converted bank address or a converted row address during the active operation and converting at least one bit of the column address of the address applied from the external portion during the read or write operation, in response to the at least one polarity selecting signal.

25. The device of claim 24, wherein the polarity selecting portion includes:

a clock generating portion for generating the at least one clock signal when the power voltage is applied; and a polarity selecting signal generating portion for generating at least one polarity selecting signal in response to the at least one clock signal and the control signal.

26. The device of claim 25, wherein the clock generating portion includes at least one ring oscillator in which a cycle variation of the clock signal generated by the power voltage and a surrounding temperature is large.

27. The device of claim 24, wherein the polarity selecting portion includes a clock generating portion for generating a clock signal when the power voltage is applied;

a delay portion for delaying the clock signal generated in the clock generating portion to output at least one delayed clock signal; and a polarity selecting signal generating portion for generating at least one polarity selecting signal in response to the at least one delayed clock signal and the control signal.

28. The device of claim 27, wherein the clock generating portion includes a ring oscillator in which a cycle variation of the clock signal generated by the power voltage and a surrounding temperature is large.

29. The device of claim 27, wherein the delay portion includes at least one buffer, and when the delay portion includes a plurality of buffers, the buffers have different delay times each other.

30. The device of claim 24, wherein the address converting portion includes at least one XOR circuit.

31. The device of claim 24, wherein the mode setting portion additionally sets a test control signal during the mode setting operation.

32. The device of claim 31, wherein the address converting portion includes:

a first transmission gate for transmitting the converted address in response to the test control signal;

a second transmission gate for transmitting the at least one polarity selecting signal in response to the test control signal; and a XOR gate for receiving and XORing the converted address and the polarity selecting signal transmitted from the second transmission gate to output the same address as the address applied from the external portion.

33. The device of claim 24, further comprising, a burst control portion for generating a sequential column address and outputting the sequential column address to the address converting portion during a burst operation for reading or writing data of a sequential address in response to the column address applied from the address converting portion.

* * * * *